(12) United States Patent
Smith et al.

(10) Patent No.: US 7,012,433 B2
(45) Date of Patent: Mar. 14, 2006

(54) BATTERY TESTER UPGRADE USING SOFTWARE KEY

(75) Inventors: Clark E. Smith, Oswego, IL (US); Kevin I. Bertness, Batavia, IL (US); Stephen J. McShane, Oak Brook, IL (US)

(73) Assignee: Midtronics, Inc., Willowbrook, IL (US)

( * ) Notice: Subject to any disclaimer, the term of this patent is extended or adjusted under 35 U.S.C. 154(b) by 424 days.

(21) Appl. No.: 10/246,439

(22) Filed: Sep. 18, 2002

(65) Prior Publication Data

US 2004/0051532 A1 Mar. 18, 2004

(51) Int. Cl.
*G01N 27/416* (2006.01)

(52) U.S. Cl. ........................................ 324/426; 324/427
(58) Field of Classification Search ................ 324/426, 324/427, 429, 428, 431; 320/132, 134, 136, 320/137
See application file for complete search history.

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |

(Continued)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |

(Continued)

OTHER PUBLICATIONS

"Electrochemical Impedance Spectroscopy in Battery Development and Testing", *Batteries International*, Apr. 1997, pp. 59 and 62–63.

(Continued)

*Primary Examiner*—Lawrence Luk
(74) *Attorney, Agent, or Firm*—Westman, Champlin & Kelly

(57) ABSTRACT

An electronic battery tester, comprising first and second connectors configured to electrically couple to terminals of the battery, a microprocessor configured to test the battery using the first and second connectors, a memory containing a set of locked instructions for the microprocessor, an input configured to receive a software unlocking key, and the microprocessor configured to execute the set of locked instructions in response to the software unlocking key corresponding a predetermined software unlocking key.

37 Claims, 4 Drawing Sheets

U.S. PATENT DOCUMENTS

| | | |
|---|---|---|
| 3,979,664 A | 9/1976 | Harris .......................... 324/17 |
| 3,984,762 A | 10/1976 | Dowgiallo, Jr. ............ 324/29.5 |
| 3,984,768 A | 10/1976 | Staples ......................... 324/62 |
| 3,989,544 A | 11/1976 | Santo .......................... 429/65 |
| 4,008,619 A | 2/1977 | Alcaide et al. ............... 73/398 |
| 4,024,953 A | 5/1977 | Nailor, III ................. 206/344 |
| 4,047,091 A | 9/1977 | Hutchines et al. ............ 363/59 |
| 4,053,824 A | 10/1977 | Dupuis et al. ............. 324/29.5 |
| 4,070,624 A | 1/1978 | Taylor ........................ 327/158 |
| 4,086,531 A | 4/1978 | Bernier ...................... 324/158 |
| 4,112,351 A | 9/1978 | Back et al. .................... 324/16 |
| 4,114,083 A | 9/1978 | Benham et al. ............... 320/39 |
| 4,126,874 A | 11/1978 | Suzuki et al. ................. 354/60 |
| 4,178,546 A | 12/1979 | Hulls et al. ................. 324/158 |
| 4,193,025 A | 3/1980 | Frailing et al. ............. 324/427 |
| 4,207,611 A | 6/1980 | Gordon ...................... 364/580 |
| 4,217,645 A | 8/1980 | Barry et al. ................. 364/483 |
| 4,297,639 A | 10/1981 | Branham .................... 324/429 |
| 4,315,204 A | 2/1982 | Sievers et al. ................ 322/28 |
| 4,316,185 A | 2/1982 | Watrous et al. ............. 340/636 |
| 4,322,685 A | 3/1982 | Frailing et al. ............. 324/429 |
| 4,351,405 A | 9/1982 | Fields et al. .................. 180/65 |
| 4,361,809 A | 11/1982 | Bil et al. ..................... 324/426 |
| 4,363,407 A | 12/1982 | Buckler et al. ............... 209/3.3 |
| 4,369,407 A | 1/1983 | Korbell ....................... 324/416 |
| 4,379,989 A | 4/1983 | Kurz et al. .................... 320/26 |
| 4,379,990 A | 4/1983 | Sievers et al. ................ 322/99 |
| 4,390,828 A | 6/1983 | Converse et al. ............. 320/32 |
| 4,392,101 A | 7/1983 | Saar et al. ..................... 320/20 |
| 4,396,880 A | 8/1983 | Windebank ................... 320/21 |
| 4,408,157 A | 10/1983 | Beaubien ...................... 324/62 |
| 4,412,169 A | 10/1983 | Dell'Orto ..................... 320/64 |
| 4,423,378 A | 12/1983 | Marino et al. ............... 324/427 |
| 4,423,379 A | 12/1983 | Jacobs et al. ............... 324/429 |
| 4,424,491 A | 1/1984 | Bobbett et al. ............. 324/433 |
| 4,459,548 A | 7/1984 | Lentz et al. ................. 324/158 |
| 4,514,694 A | 4/1985 | Finger ....................... 324/429 |
| 4,520,353 A | 5/1985 | McAuliffe .................. 340/636 |
| 4,564,798 A | 1/1986 | Young ............................ 320/6 |
| 4,633,418 A | 12/1986 | Bishop ....................... 364/554 |
| 4,659,977 A | 4/1987 | Kissel et al. .................. 320/64 |
| 4,663,580 A | 5/1987 | Wortman ...................... 320/35 |
| 4,665,370 A | 5/1987 | Holland ...................... 324/430 |
| 4,667,143 A | 5/1987 | Cooper et al. ................ 320/22 |
| 4,667,279 A | 5/1987 | Maier .......................... 363/46 |
| 4,678,998 A | 7/1987 | Muramatsu ................. 324/427 |
| 4,679,000 A | 7/1987 | Clark .......................... 324/428 |
| 4,680,528 A | 7/1987 | Mikami et al. ............... 320/32 |
| 4,697,134 A | 9/1987 | Burkum et al. ............... 320/48 |
| 4,707,795 A | 11/1987 | Alber et al. ................. 364/550 |
| 4,709,202 A | 11/1987 | Koenck et al. ............... 320/43 |
| 4,710,861 A | 12/1987 | Kanner ........................ 363/46 |
| 4,719,428 A | 1/1988 | Liebermann ................ 324/436 |
| 4,743,855 A | 5/1988 | Randin et al. ............... 324/430 |
| 4,745,349 A | 5/1988 | Palanisamy et al. .......... 320/22 |
| 4,816,768 A | 3/1989 | Champlin ................... 324/428 |
| 4,820,966 A | 4/1989 | Fridman ....................... 320/32 |
| 4,825,170 A | 4/1989 | Champlin ................... 324/436 |
| 4,847,547 A | 7/1989 | Eng, Jr. et al. ............... 320/35 |
| 4,849,700 A | 7/1989 | Morioka et al. ............. 324/427 |
| 4,876,495 A | 10/1989 | Palanisamy et al. .......... 320/18 |
| 4,881,038 A | 11/1989 | Champlin ................... 324/426 |
| 4,912,416 A | 3/1990 | Champlin ................... 324/430 |
| 4,913,116 A | 4/1990 | Katogi et al. ............... 123/492 |
| 4,929,931 A | 5/1990 | McCuen ..................... 340/636 |
| 4,931,738 A | 6/1990 | MacIntyre et al. .......... 324/435 |
| 4,933,845 A * | 6/1990 | Hayes ........................ 710/104 |
| 4,937,528 A | 6/1990 | Palanisamy ................. 324/430 |
| 4,947,124 A | 8/1990 | Hauser ....................... 324/430 |
| 4,956,597 A | 9/1990 | Heavey et al. ................ 320/14 |
| 4,968,941 A | 11/1990 | Rogers ....................... 324/428 |
| 4,968,942 A | 11/1990 | Palanisamy ................. 324/430 |
| 5,004,979 A | 4/1991 | Marino et al. ............... 324/160 |
| 5,032,825 A | 7/1991 | Kuznicki .................... 340/636 |
| 5,037,778 A | 8/1991 | Stark et al. .................. 437/216 |
| 5,047,722 A | 9/1991 | Wurst et al. ................. 324/430 |
| 5,087,881 A | 2/1992 | Peacock ..................... 324/378 |
| 5,095,223 A | 3/1992 | Thomas ...................... 307/110 |
| 5,126,675 A | 6/1992 | Yang .......................... 324/435 |
| 5,140,269 A | 8/1992 | Champlin ................... 324/433 |
| 5,144,218 A | 9/1992 | Bosscha ........................ 320/44 |
| 5,144,248 A | 9/1992 | Alexandres et al. ......... 324/428 |
| 5,160,881 A | 11/1992 | Schramm et al. .............. 322/7 |
| 5,170,124 A | 12/1992 | Blair et al. .................. 324/434 |
| 5,179,335 A | 1/1993 | Nor ............................. 320/21 |
| 5,194,799 A | 3/1993 | Tomantschger ................ 320/2 |
| 5,204,611 A | 4/1993 | Nor et al. ..................... 320/21 |
| 5,214,370 A | 5/1993 | Harm et al. ................... 320/35 |
| 5,214,385 A | 5/1993 | Gabriel et al. .............. 324/434 |
| 5,241,275 A | 8/1993 | Fang .......................... 324/430 |
| 5,254,952 A | 10/1993 | Salley et al. ................ 324/439 |
| 5,266,880 A | 11/1993 | Newland ...................... 320/14 |
| 5,281,919 A | 1/1994 | Palanisamy ................. 324/427 |
| 5,281,920 A | 1/1994 | Wurst ......................... 324/430 |
| 5,295,078 A | 3/1994 | Stich et al. .................. 364/483 |
| 5,298,797 A | 3/1994 | Redl .......................... 307/246 |
| 5,300,874 A | 4/1994 | Shimamoto et al. .......... 320/15 |
| 5,302,902 A | 4/1994 | Groehl ....................... 324/434 |
| 5,315,287 A | 5/1994 | Sol ............................. 340/455 |
| 5,321,626 A | 6/1994 | Palladino ................... 364/483 |
| 5,331,268 A | 7/1994 | Patino et al. ................. 320/20 |
| 5,336,993 A | 8/1994 | Thomas et al. ........... 324/158.1 |
| 5,338,515 A | 8/1994 | Dalla Betta et al. .......... 422/95 |
| 5,339,018 A | 8/1994 | Brokaw ....................... 320/35 |
| 5,343,380 A | 8/1994 | Champlin ..................... 363/46 |
| 5,347,163 A | 9/1994 | Yoshimura ................... 307/66 |
| 5,352,968 A | 10/1994 | Reni et al. .................... 320/35 |
| 5,365,160 A | 11/1994 | Leppo et al. .................. 320/22 |
| 5,365,453 A | 11/1994 | Startup et al. .............. 364/481 |
| 5,381,096 A | 1/1995 | Hirzel ........................ 324/427 |
| 5,412,323 A | 5/1995 | Kato et al. .................. 324/429 |
| 5,426,371 A | 6/1995 | Salley et al. ................ 324/429 |
| 5,426,416 A | 6/1995 | Jefferies et al. ............. 340/664 |
| 5,432,426 A | 7/1995 | Yoshida ....................... 320/20 |
| 5,434,495 A | 7/1995 | Toko ........................... 320/44 |
| 5,435,185 A | 7/1995 | Eagan .......................... 73/587 |
| 5,442,274 A | 8/1995 | Tamai ......................... 320/23 |
| 5,445,026 A | 8/1995 | Eagan .......................... 73/591 |
| 5,449,996 A | 9/1995 | Matsumoto et al. .......... 320/20 |
| 5,449,997 A | 9/1995 | Gilmore et al. ............... 320/39 |
| 5,451,881 A | 9/1995 | Finger ........................ 324/433 |
| 5,457,377 A | 10/1995 | Jonsson ......................... 320/5 |
| 5,469,043 A | 11/1995 | Cherng et al. ................ 320/31 |
| 5,485,090 A | 1/1996 | Stephens .................... 324/433 |
| 5,488,300 A | 1/1996 | Jamieson .................... 324/432 |
| 5,519,383 A | 5/1996 | De La Rosa ................ 340/636 |
| 5,528,148 A | 6/1996 | Rogers ....................... 324/426 |
| 5,537,967 A | 7/1996 | Tashiro et al. ............ 123/792.1 |
| 5,546,317 A | 8/1996 | Andrieu ...................... 364/481 |
| 5,548,273 A | 8/1996 | Nicol et al. ................. 340/439 |
| 5,550,485 A | 8/1996 | Falk ........................... 324/772 |
| 5,561,380 A | 10/1996 | Sway-Tin et al. ........... 324/509 |
| 5,562,501 A | 10/1996 | Kinoshita et al. ........... 439/852 |
| 5,563,496 A | 10/1996 | McClure ...................... 320/48 |
| 5,572,136 A | 11/1996 | Champlin ................... 324/426 |
| 5,574,355 A | 11/1996 | McShane et al. ............. 320/39 |
| 5,583,416 A | 12/1996 | Klang ......................... 320/22 |
| 5,585,728 A | 12/1996 | Champlin ................... 324/427 |
| 5,589,757 A | 12/1996 | Klang ......................... 320/22 |
| 5,592,093 A | 1/1997 | Klingbiel .................... 324/426 |
| 5,596,260 A | 1/1997 | Moravec et al. .............. 320/30 |

| | | | | | | |
|---|---|---|---|---|---|---|
| 5,598,098 A | 1/1997 | Champlin .................... 324/430 | | 6,161,640 A | 12/2000 | Yamaguchi ................. 180/65.8 |
| 5,602,462 A | 2/1997 | Stich et al. .................. 323/258 | | 6,163,156 A | 12/2000 | Bertness ..................... 324/426 |
| 5,606,242 A | 2/1997 | Hull et al. .................... 320/48 | | 6,167,349 A | 12/2000 | Alvarez ....................... 702/63 |
| 5,621,298 A | 4/1997 | Harvey .......................... 320/5 | | 6,172,483 B1 | 1/2001 | Champlin .................... 320/134 |
| 5,633,985 A | 5/1997 | Severson et al. .......... 395/2.76 | | 6,172,505 B1 | 1/2001 | Bertness ..................... 324/430 |
| 5,637,978 A | 6/1997 | Kellett et al. ................. 320/2 | | 6,181,545 B1 | 1/2001 | Amatucci et al. ........... 361/502 |
| 5,642,031 A | 6/1997 | Brotto .......................... 320/21 | | 6,222,369 B1 | 4/2001 | Champlin .................... 324/430 |
| 5,650,937 A | 7/1997 | Bounaga ..................... 364/483 | | 6,225,808 B1 | 5/2001 | Varghese et al. ............ 324/426 |
| 5,652,501 A | 7/1997 | McClure et al. .............. 320/17 | | 6,236,332 B1 | 5/2001 | Conkright et al. ...... 340/825.06 |
| 5,653,659 A | 8/1997 | Kunibe et al. ............... 477/111 | | 6,249,124 B1 | 6/2001 | Bertness ..................... 324/426 |
| 5,656,920 A | 8/1997 | Cherng et al. ................ 320/31 | | 6,250,973 B1 | 6/2001 | Lowery et al. .............. 439/763 |
| 5,675,234 A | 10/1997 | Greene ........................ 320/15 | | 6,254,438 B1 | 7/2001 | Gaunt ........................ 439/755 |
| 5,677,077 A | 10/1997 | Faulk ........................... 429/90 | | 6,259,254 B1 | 7/2001 | Klang ......................... 324/427 |
| 5,699,050 A | 12/1997 | Kanazawa ................... 340/636 | | 6,262,563 B1 | 7/2001 | Champlin .................... 320/134 |
| 5,701,089 A | 12/1997 | Perkins ........................ 327/772 | | 6,294,896 B1 | 9/2001 | Champlin .................... 320/134 |
| 5,705,929 A | 1/1998 | Caravello et al. ............ 324/430 | | 6,294,897 B1 | 9/2001 | Champlin .................... 320/153 |
| 5,710,503 A | 1/1998 | Sideris et al. .................. 320/6 | | 6,304,087 B1 | 10/2001 | Bertness ..................... 324/426 |
| 5,711,648 A | 1/1998 | Hammerslag ................ 414/786 | | 6,307,349 B1 | 10/2001 | Koenck et al. .............. 320/112 |
| 5,717,336 A | 2/1998 | Basell et al. ................. 324/430 | | 6,310,481 B1 | 10/2001 | Bertness ..................... 324/430 |
| 5,717,937 A | 2/1998 | Fritz ...................... 395/750.01 | | 6,313,607 B1 | 11/2001 | Champlin .................... 320/132 |
| 5,739,667 A | 4/1998 | Matsuda et al. ............... 320/5 | | 6,313,608 B1 * | 11/2001 | Varghese et al. ............ 320/132 |
| 5,745,044 A * | 4/1998 | Hyatt et al. ................ 340/5.23 | | 6,316,914 B1 | 11/2001 | Bertness ..................... 320/134 |
| 5,747,909 A | 5/1998 | Syverson et al. ............ 310/156 | | 6,323,650 B1 | 11/2001 | Bertness et al. ............. 324/426 |
| 5,754,417 A | 5/1998 | Nicollini ...................... 363/60 | | 6,329,793 B1 | 12/2001 | Bertness et al. ............. 320/132 |
| 5,757,192 A | 5/1998 | McShane et al. ............ 324/427 | | 6,331,762 B1 | 12/2001 | Bertness ..................... 320/134 |
| 5,760,587 A | 6/1998 | Harvey ....................... 324/434 | | 6,332,113 B1 | 12/2001 | Bertness ....................... 702/63 |
| 5,773,978 A | 6/1998 | Becker ........................ 324/430 | | 6,346,795 B1 | 2/2002 | Haraguchi et al. ........... 320/136 |
| 5,789,899 A | 8/1998 | van Phuoc et al. ............ 320/30 | | 6,347,958 B1 | 2/2002 | Tsai ........................... 439/488 |
| 5,793,359 A | 8/1998 | Ushikubo .................... 345/169 | | 6,351,102 B1 | 2/2002 | Troy .......................... 320/139 |
| 5,796,239 A | 8/1998 | van Phuoc et al. .......... 320/107 | | 6,359,441 B1 | 3/2002 | Bertness ..................... 324/426 |
| 5,808,469 A | 9/1998 | Kopera ...................... 324/43.4 | | 6,363,303 B1 | 3/2002 | Bertness ....................... 701/29 |
| 5,818,234 A | 10/1998 | McKinnon .................. 324/433 | | 6,384,608 B1 | 5/2002 | Namaky ...................... 324/425 |
| 5,821,756 A | 10/1998 | McShane et al. ............ 324/430 | | 6,388,448 B1 | 5/2002 | Cervas ........................ 324/426 |
| 5,821,757 A | 10/1998 | Alvarez et al. .............. 324/434 | | 6,392,414 B1 | 5/2002 | Bertness ..................... 324/429 |
| 5,825,174 A | 10/1998 | Parker ........................ 324/106 | | 6,411,098 B1 | 6/2002 | Laletin ........................ 324/436 |
| 5,831,435 A | 11/1998 | Troy .......................... 324/426 | | 6,417,669 B1 | 7/2002 | Champlin .................... 324/426 |
| 5,862,515 A | 1/1999 | Kobayashi et al. ........... 702/63 | | 6,424,158 B1 | 7/2002 | Klang ......................... 324/433 |
| 5,872,443 A | 2/1999 | Williamson ................... 320/21 | | 6,441,585 B1 | 8/2002 | Bertness ..................... 320/132 |
| 5,895,440 A | 4/1999 | Proctor et al. ................. 702/63 | | 6,445,158 B1 | 9/2002 | Bertness et al. ............. 320/104 |
| 5,914,605 A | 6/1999 | Bertness ..................... 324/430 | | 6,456,045 B1 | 9/2002 | Troy et al. ................... 320/139 |
| 5,927,938 A | 7/1999 | Hammerslag ................ 414/809 | | 6,466,025 B1 | 10/2002 | Klang ......................... 324/429 |
| 5,929,609 A | 7/1999 | Joy et al. ...................... 322/25 | | 6,466,026 B1 | 10/2002 | Champlin .................... 324/430 |
| 5,939,855 A | 8/1999 | Proctor et al. ............... 320/104 | | 6,600,815 B1 * | 7/2003 | Walding ..................... 379/93.07 |
| 5,939,861 A | 8/1999 | Joko et al. ................... 320/122 | | 6,618,644 B1 * | 9/2003 | Bean .......................... 700/231 |
| 5,945,829 A | 8/1999 | Bertness ..................... 324/430 | | 2002/0176010 A1 * | 11/2002 | Wallach et al. ........... 348/229.1 |
| 5,951,229 A | 9/1999 | Hammerslag ................ 414/398 | | | | |
| 5,961,561 A | 10/1999 | Wakefield, II ................. 701/29 | | | | |
| 5,961,604 A | 10/1999 | Anderson et al. ............ 709/229 | | | | |
| 5,969,625 A | 10/1999 | Russo ......................... 340/636 | | | | |
| 5,978,805 A * | 11/1999 | Carson ......................... 707/10 | | | | |
| 6,002,238 A | 12/1999 | Champlin .................... 320/134 | | | | |
| 6,005,759 A * | 12/1999 | Hart et al. .................... 361/66 | | | | |
| 6,008,652 A | 12/1999 | Theofanopoulos et al. . 324/434 | | | | |
| 6,009,369 A | 12/1999 | Boisvert et al. ............... 701/99 | | | | |
| 6,031,354 A | 2/2000 | Wiley et al. ................. 320/116 | | | | |
| 6,037,751 A | 3/2000 | Klang ......................... 320/160 | | | | |
| 6,037,777 A | 3/2000 | Champlin .................... 324/430 | | | | |
| 6,051,976 A | 4/2000 | Bertness ..................... 324/426 | | | | |
| 6,064,372 A * | 5/2000 | Kahkoska .................... 345/173 | | | | |
| 6,072,299 A | 6/2000 | Kurie et al. ................. 320/112 | | | | |
| 6,072,300 A | 6/2000 | Tsuji .......................... 320/116 | | | | |
| 6,081,098 A | 6/2000 | Bertness et al. ............. 320/134 | | | | |
| 6,091,245 A | 7/2000 | Bertness ..................... 324/426 | | | | |
| 6,094,033 A | 7/2000 | Ding et al. .................. 320/132 | | | | |
| 6,104,167 A | 8/2000 | Bertness et al. ............. 320/132 | | | | |
| 6,114,834 A | 9/2000 | Parise ........................ 320/109 | | | | |
| 6,137,269 A | 10/2000 | Champlin .................... 320/150 | | | | |
| 6,140,797 A | 10/2000 | Dunn .......................... 320/105 | | | | |
| 6,144,185 A | 11/2000 | Dougherty et al. .......... 320/132 | | | | |
| 6,150,793 A | 11/2000 | Lesesky et al. .............. 320/104 | | | | |
| 6,158,000 A * | 12/2000 | Collins .......................... 713/1 | | | | |

FOREIGN PATENT DOCUMENTS

| | | |
|---|---|---|
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. McDonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–$4^{th}$–Order Elliptic Notch Filter", 12/94, RRD–B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

\* cited by examiner

BATTERY TESTER UPGRADE USING SOFTWARE KEY

BACKGROUND OF THE INVENTION

The present invention relates to storage batteries. More specifically, the present invention relates to a battery system tester for testing storage batteries.

Storage batteries, such as lead acid storage batteries of the type used in the automotive industry, have existed for many years. These storage batteries usually consist of a plurality of individual storage cells electrically connected in series. Typically, each cell has a voltage potential of about 2.1 volts. By connecting the cells in series, the voltage of the individual cells are added in a cumulative manner. For example, in a typical automotive storage battery, six storage cells are used to provide a total voltage when the battery is fully charged up to 12.6 volts.

Several techniques have been used to test the condition of storage batteries. These techniques include a voltage test to determine if the battery voltage is below a certain threshold, and a load test that involves discharging a battery using a known load. A more recent technique involves measuring the conductance of the storage batteries. This technique, which has been pioneered by Dr. Keith S. Champlin and Midtronics, Inc. of Burr Ridge, Ill., is described in a number of U.S. patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELEC- TRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Ser. No. 09/595,102, filed Jun. 15, 2000, entitled APPARATUS AND METHOD FOR TESTING RECHARGEABLE ENERGY STORAGE BATTERIES; U.S. Ser. No. 09/703,270, filed Oct. 31, 2000, entitled ELECTRONIC BATTERY TESTER; U.S. Ser. No. 09/575,629, filed May 22, 2000, entitled VEHICLE ELECTRICAL SYSTEM TESTER WITH ENCODED OUTPUT; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483,623, filed Jan. 13, 2000, entitled ALTERNATOR TESTER; U.S. Ser. No. 09/870,410, filed May 30, 2001, entitled INTEGRATED CONDUCTANCE AND LOAD TEST BASED ELECTRONIC BATTERY TESTER; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/876,564, filed Jun. 7, 2001, entitled ELECTRONIC BATTERY TESTER; U.S. Ser. No. 09/878,625, filed Jun. 11, 2001, entitled SUPPRESSING INTERFERENCE IN AC MEASUREMENTS OF CELLS, BATTERIES AND OTHER ELECTRICAL ELEMENTS; U.S. Ser. No. 09/902,492, filed Jul. 10, 2001, entitled APPARATUS AND METHOD FOR CARRYING OUT DIAGNOSTIC TESTS ON BATTERIES AND FOR RAPIDLY CHARGING BATTERIES; and U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 09/977,049, filed Oct. 12, 2001, untitled PROGRAMMABLE CURRENT EXCITER FOR MEASURING AC IMMITTANCE OF CELLS AND BATTERIES; U.S. Ser. No. 10/047,923, filed Oct. 23, 2001, entitled AUTOMOTIVE BATTERY CHARGING SYSTEM TESTER, U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 10/042,451, filed Jan. 8, 2002, entitled BATTERY CHARGE CONTROL DEVICE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 10/143,307, filed May 10, 2002, entitled ELECTRONIC BATTERY TESTER; U.S. Ser. No. 10/207,495, filed Jul. 29, 2002, entitled KELVIN CLAMP FOR ELECTRICALLY COUPLING TO A BATTERY CONTACT, which are incorporated herein in their entirety.

Battery testers are available in different models, with the most basic models just indicating whether the battery is "good" or "bad", and the more developed models providing information such as the state of charge of the battery, the state of health of the battery, etc. Currently, when a user needs to upgrade to a more advanced model, the user may, for example, have to place an order with the vendor, and the battery tester must be shipped to the user from inventory. This series of transactions creates delays that may frustrate the user, while adding significant overhead to the vendor's operations. Further, the vendor may be obligated to inventory and support nonrevenue producing models of battery testers.

SUMMARY OF THE INVENTION

An electronic battery tester, comprising first and second connectors configured to electrically couple to terminals of the battery, a microprocessor configured to test the battery using the first and second connectors, a memory containing a set of locked instructions for the microprocessor, an input configured to receive a software unlocking key, and the microprocessor configured to execute the set of locked instructions in response to the software unlocking key corresponding a predetermined software unlocking key.

DETAILED DESCRIPTION OF THE PREFERRED EMBODIMENTS

Embodiments of the present invention, described below, all relate to a battery testing system which includes locked battery testing instructions that can be executed upon receipt of a software unlocking key that corresponds to a predetermined software unlocking key.

Figure 1:
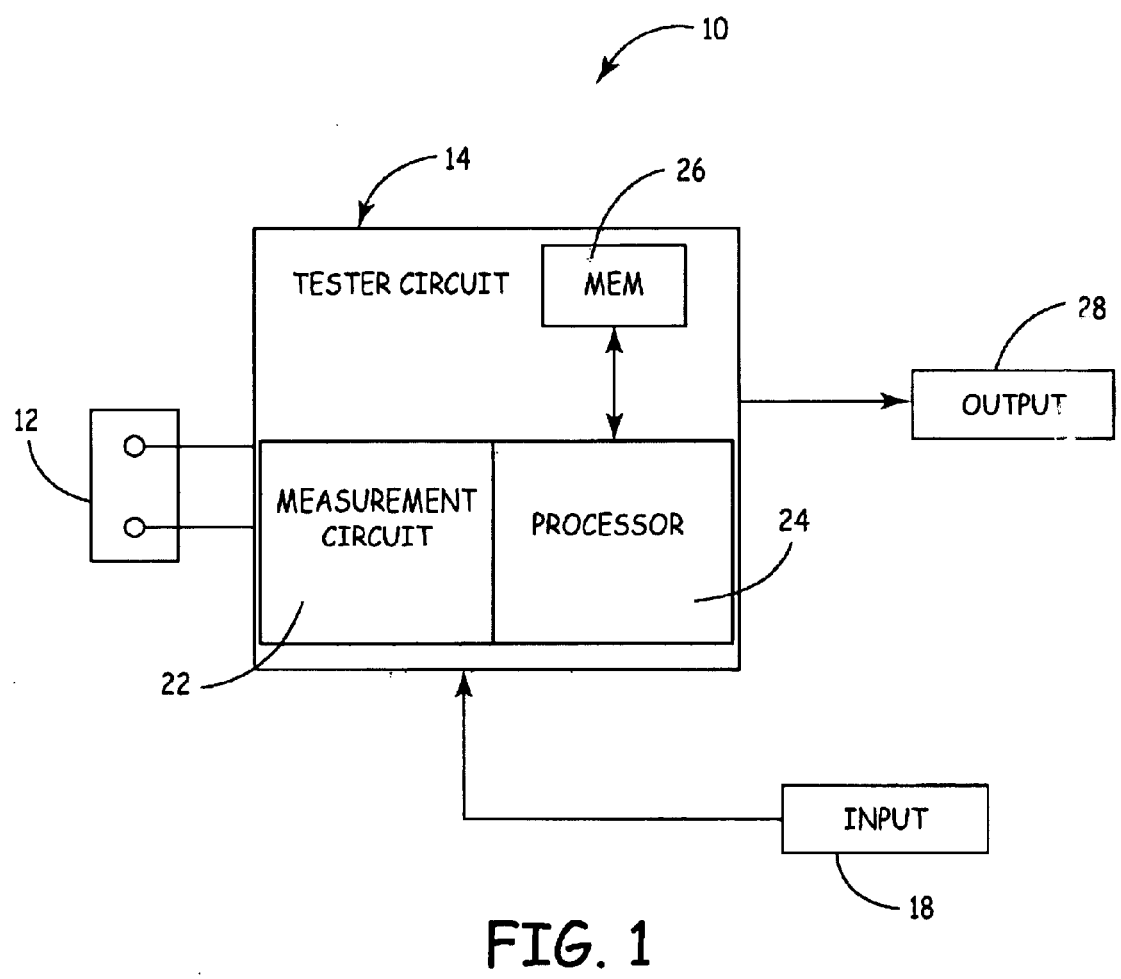
FIG. 1 is a very simplified block diagram showing a battery tester in accordance with an embodiment of the present invention.

FIG. 1 is a very simplified block diagram of a battery tester 10 in accordance with an illustrative embodiment of the present invention. The same reference numerals are used in the various figures to represent the same or similar elements. Note that FIG. 1 is a simplified block diagram of a specific type of battery tester. However, the present invention is applicable to any type of battery tester including those which do not use dynamic parameters. Other types of example testers include testers that conduct load tests, current based tests, voltage based tests, tests which apply various conditions or observe various performance parameters of a battery, etc. Battery tester 10 includes a test circuit 14 that directly couples to vehicle battery 12, an input 18 and an output 28. Test circuit 14 includes measurement circuit 22, processor 24 and memory 26. Measurement circuit 22 can be any circuit configuration which measures a dynamic parameter of battery 12. As used herein, a dynamic parameter is one which is related to a signal having an alternating current (AC) component. The signal can be either applied directly or drawn from battery 12. Example dynamic parameters include dynamic resistance, conductance, impedance, admittance, etc. This list is not exhaustive, for example, a dynamic parameter can include a component value of an equivalent circuit of battery 12. Operation of measurement circuit 22 is controlled by processor 24 which, in turn, carries out different battery testing functions based upon battery testing instructions stored in memory 26. In accordance with the present invention, the battery testing instructions are locked in memory 26 when tester 10 is delivered to a customer. Tester 10 can be utilized to test battery 12 only when it is enabled by unlocking the battery testing instructions by entering a software unlocking key that corresponds to a predetermined software unlocking key that is stored in memory 26. The software unlocking key can be entered by the user through input 18. Input 18 may be a keyboard, a reader through which a card including the software unlocking key can be swiped, etc. Input 18 can also include a keyboard that is a touchscreen or integrated with a touchscreen, a unit capable of radio frequency (RF) communication with a personal computer (PC) or a personal digital assistant (PDA), a RF identification (ID) tag, a unit capable of infrared (IR) communication with a PC or a PDA, a serial interface cable, a parallel interface cable, a universal serial bus (USB) interface cable, a bus using the Institute of Electrical and Electronics Engineers (IEEE) 1394 standard, an Ethernet interface cable, a Transmission Control Protocol/Internet Protocol (TCP/IP) internet connection, a plug-in device (such as a memory card, a memory chip, an ID button, etc.), etc. Upon receiving the software unlocking key from input 18, microprocessor 24 utilizes a key recognition module stored in memory 26 to validate the entered software unlocking key. If the software unlocking key is recognized (or found to be valid) by the key recognition routine, the key is stored in memory and the battery testing instructions are unlocked to thereby enable tester 10 for use in testing battery 12.

In preferred embodiments of the present invention, multiple locked battery testing instruction sets are stored in memory 26 and a different unique software unlocking key is required to unlock each different instruction set of the multiple battery testing instruction sets. The use of such multiple locked battery testing instruction sets to upgrade battery tester 10 is described below in connection with FIGS. 2 and 3.

Figure 2:
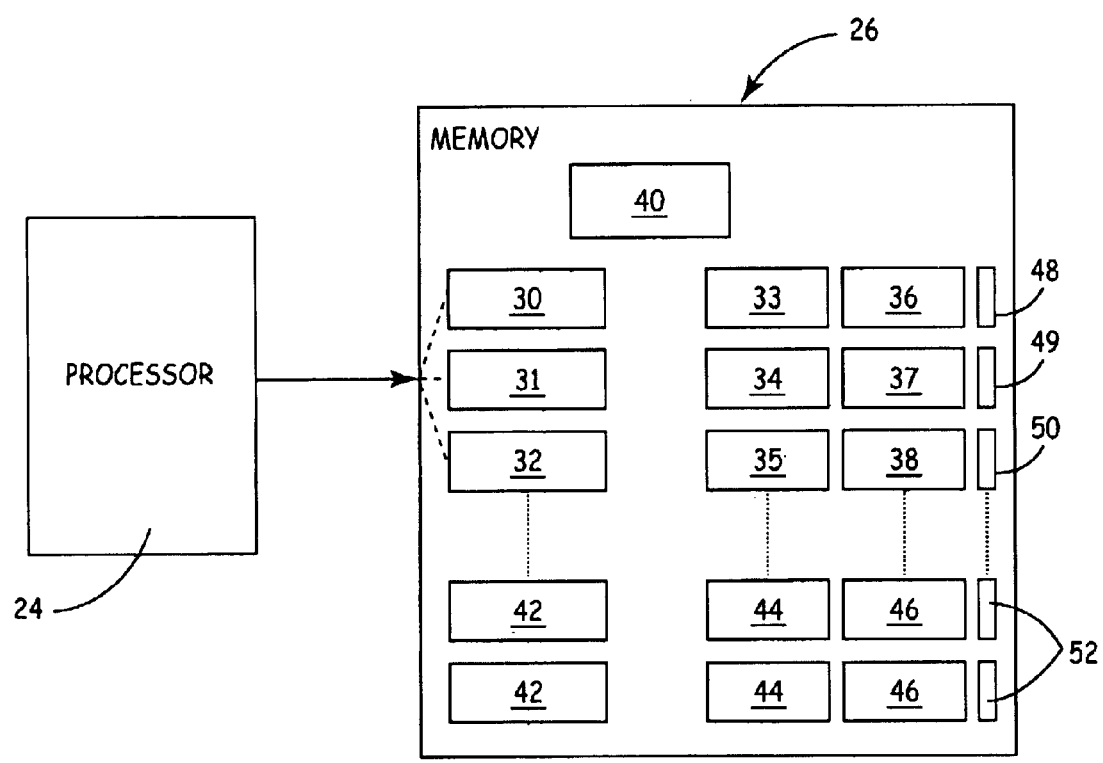
FIG. 2 is a block diagram illustrating different software modules stored in battery tester memory in accordance with an embodiment of the present invention.

FIG. 2 is a block diagram illustrating different software modules stored in battery tester memory 26 in accordance with an embodiment of the present invention. As can be seen in FIG. 2, memory 26 includes multiple battery testing instruction sets, such as, first instruction set 30, second instruction set 31 and third instruction set 32. Encrypted codes or predetermined software unlocking keys 33–35, each corresponding to a respective battery testing instruction set of instruction sets 30–32, are also stored in memory 26. Memory registers 36–38 can each store a software unlocking key that matches a respective one of encryption codes 33–35. As mentioned above, the software unlocking keys are entered by the battery tester user. Key recognition routine 40 can compare the user entered software unlocking keys, which can be stored in registers 36–38, with respective encrypted codes 33–35 and can enable one or more of corresponding instruction sets 30–32 if matches are detected between one or more unlocking keys and one or more encrypted codes 33–35. The operation of an example key recognition routine is described further below in connection with FIG. 3.

In an example embodiment of the present invention, first instruction set 30 contains basic functions which, when executed, only provide an output indicating whether battery 12 is "good" or "bad". Second instruction set 31 contains more advanced functions which, when executed, provide an output indicating the state of charge, state of health, etc., of battery 12. Third instruction set 32 contains functions which, when executed, provide an output related to a replacement battery or replacement options for battery 12. Each instruction set is in a locked condition when battery tester 10 is delivered to the user. The price of tester 10 is tied to the number of software unlocking keys that the user purchases. For example, the user may purchase battery tester 10 and only one software unlocking key to enable first instruction set 30 at a relatively low price. Subsequently, if the user desires an upgrade of the functions, the user may, for example, call a 1-800 number and, upon providing a credit card number, obtain an unlocking key for second instruction set 31 and/or third instruction set 32. Thus, the upgrade of battery tester 10 takes place locally after the appropriate software unlocking key is input into tester 10.

In some embodiments of the present invention, additional instruction sets may be provided to battery tester 10 by coupling input 18 to a separate device or remote system via a telephone line, for example, and downloading the additional instruction sets into memory locations 42 and corresponding encrypted codes or predetermined software unlocking keys into memory locations 44 form the remote system. Additional unlocking keys entered by the battery tester user for unlocking the additional instruction sets can be stored in memory registers 46.

Figure 3:
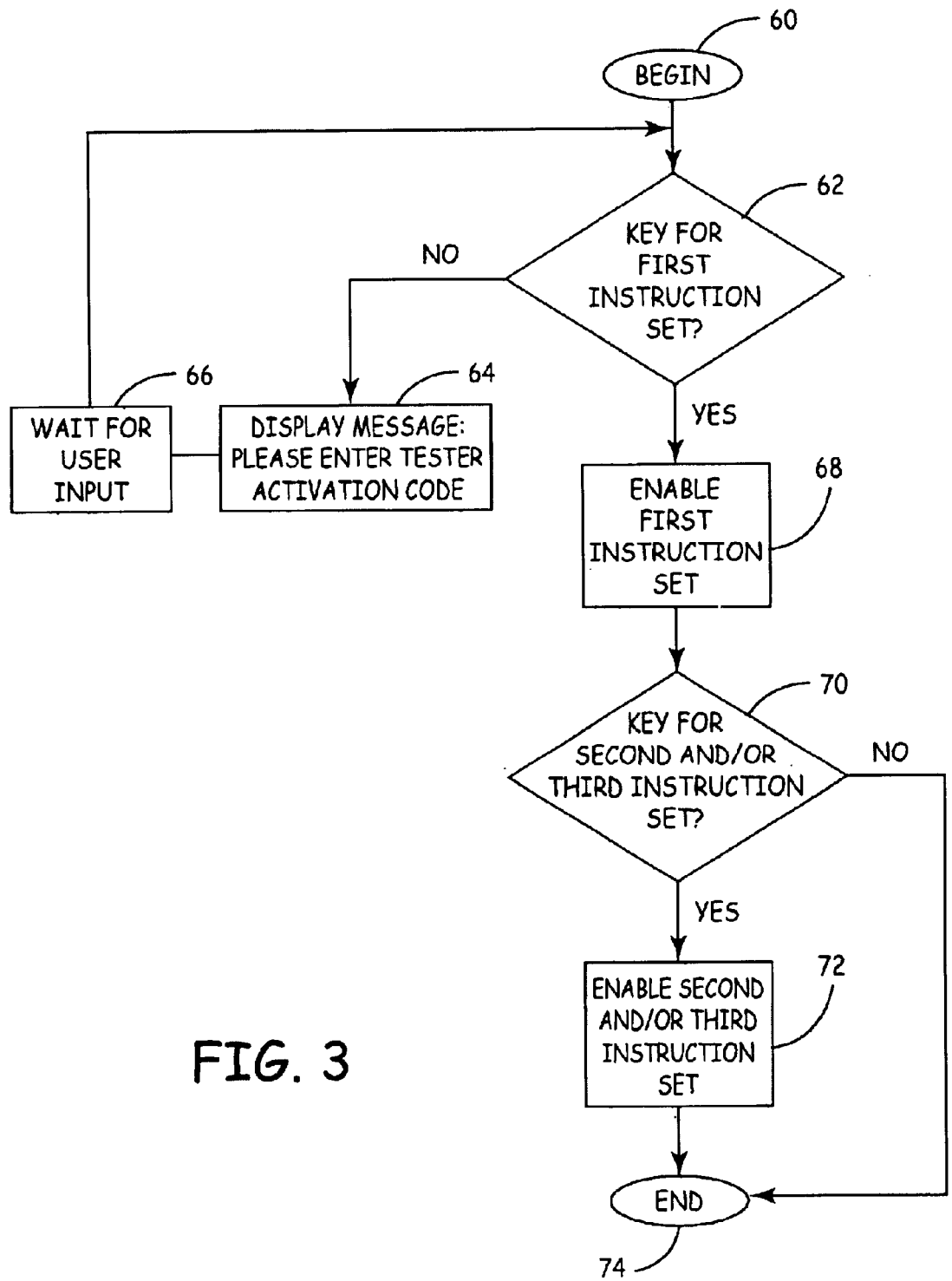
FIG. 3 is a flow chart illustrating the operation of battery tester key recognition routine in accordance with an embodiment of the present invention.

In embodiments of the present invention, key recognition routine 40 can be executed by microprocessor 24 each time it receives a start test command, which may be provided by the tester user through input 18. FIG. 3 is a flow chart illustrating the operation of key recognition routine 40 in accordance with an embodiment of the present invention. The routine begins at step 60 and proceeds to step 62 at which a determination is made as to whether the software unlocking key for first instruction set 30 is valid. This step may involve comparing the contents of register 36 with encrypted code 33. If the comparison indicates that the software unlocking key is invalid, a message is displayed to the user requesting the user to enter an activation code (or unlocking key) at step 64 and the routine waits for the user input at step 66. Upon receipt of the user input, control returns to step 62. If the comparison indicates that the software unlocking key is valid, first instruction set 30 is enabled at step 68 by setting a status flag in register 48 to a predetermined value. At step 70, a determination is made as to whether the software unlocking key for second instruction set 31 and/or the unlocking key for third instruction set 32 is valid. This step involves a comparison of encrypted codes 34 and 35 and unlocking keys in registers 37 and 38. If no matches are detected between the unlocking keys and the encrypted codes, the routine ends at step 74. If one or more matches are detected, second instruction set 31 and/or third instruction set 32 are enabled by appropriately setting status flags in registers 49 and 50 to predetermined values at step 72 before the routine ends at step 74.

In some embodiments of the present invention, key recognition routine 40 first checks if the status flags in registers 48–50 are set to an appropriate predetermined value that indicates that the instruction sets are enabled and only carries out a comparison of software unlocking keys and encryption codes for instruction sets that are not in an enabled status. Status flags for instruction sets that are subsequently downloaded into memory locations 42 are stored in registers 52.

In some embodiments of the present invention, all instruction sets are enabled for trial use (for example, one-time use) when tester 10 is delivered to the user. This may be carried out by setting status flags in registers 48–50 to appropriate predetermined values that indicate one-time activation of instruction sets 30–32.

In some embodiments of the present invention, encrypted codes 33–35 for a particular battery include the encrypted serial number of the particular battery tester unit. Thus, each predetermined software unlocking key or encrypted code of encrypted codes 33–35 for a particular battery tester unit can consist of a combination of the encrypted serial number for the battery tester unit and one or more characters and/or digits that render each encrypted code of encrypted codes 33–35 unique.

As used herein, "the microprocessor executing the set of locked instructions in response to a software unlocking key corresponding to a predetermined software unlocking key" includes the microprocessor being configured to execute the set of locked instructions if the software unlocking key corresponding to the predetermined software unlocking key is stored in the memory, the microprocessor being configured to execute the set of locked instructions if a status flag is set to a predetermined value in the memory, the microprocessor being configured to execute the first set of locked instructions upon receipt of a start test command, etc.

Figure 4:
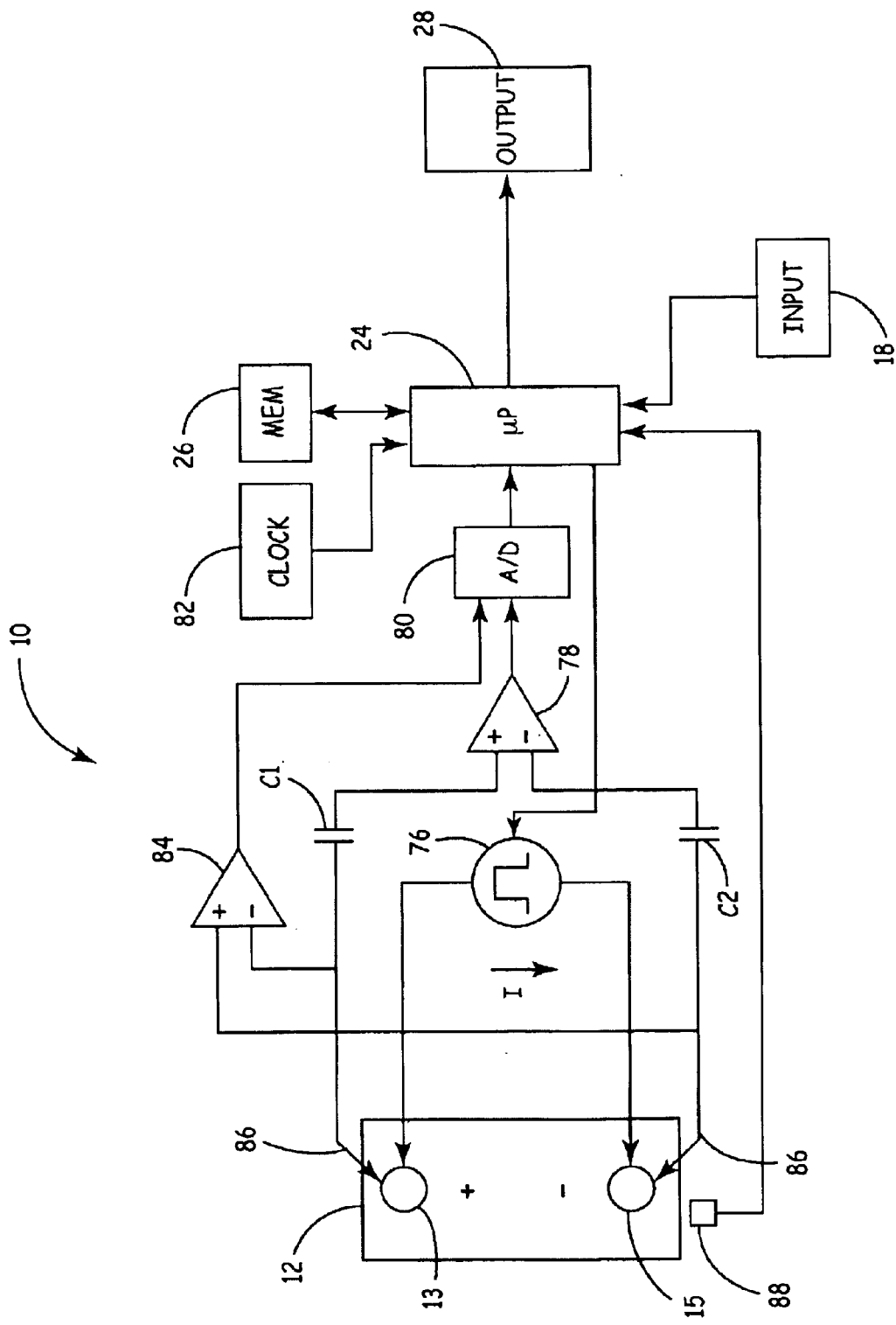
FIG. 4 is a simplified block diagram showing details of battery tester measurement circuit in accordance with an embodiment of the present invention.

FIG. 4 is a simplified block diagram of electronic battery tester circuitry 10 in accordance with a specific embodiment of the present invention. Apparatus 10 is shown coupled to battery 12 which includes a positive battery terminal 13 and a negative battery terminal 15. Circuitry 10 includes current source 76, differential amplifier 78, analog-to-digital converter 80 and microprocessor 24. Amplifier 78 is capacitively coupled to battery 12 through capacitors $C_1$ and $C_2$. Amplifier 78 has an output connected to an input of analog-to-digital converter 80. Microprocessor 24 is connected to system clock 82, memory 26 and analog-to-digital converter 80. Microprocessor 24 is also capable of receiving an input from input device 18. Microprocessor 24 also connects to output device 28.

In operation, current source 76 is controlled by microprocessor 24 and provides current I in the direction shown by the arrow in FIG. 4. In one embodiment, this is a square wave or a pulse. Differential amplifier 78 is connected to terminals 13 and 15 of battery 12 through capacitors $C_1$ and $C_2$, respectively, and provides an output related to the voltage potential difference between terminals 13 and 15. In a preferred embodiment, amplifier 78 has a high input impedance. Circuitry 10 includes differential amplifier 84 having inverting and noninverting inputs connected to terminals 13 and 15, respectively. Amplifier 84 is connected to measure the open circuit potential voltage ($V_{BAT}$) of battery 12 between terminals 13 and 15. The output of amplifier 84 is provided to analog-to-digital converter 80 such that the voltage across terminals 13 and 15 can be measured by microprocessor 24.

Circuitry 10 is connected to battery 12 through a four-point connection technique known as a Kelvin connection. This Kelvin connection 86 allows current I to be injected into battery 10 through a first pair of terminals while the voltage V across the terminals 13 and 15 is measured by a second pair of connections. Because very little current flows through amplifier 78, the voltage drop across the inputs to amplifier 78 is substantially identical to the voltage drop across terminals 13 and 15 of battery 12. The output of differential amplifier 78 is converted to a digital format and is provided to microprocessor 24. Microprocessor 24 operates at a frequency determined by system clock 82 and in accordance with programming instructions stored in memory 26.

Microprocessor 26 determines the conductance of battery 12 by applying a current pulse I using current source 76. The microprocessor determines the change in battery voltage due to the current pulse I using amplifier 78 and analog-to-digital converter 80. The value of current I generated by current source 76 is known and is stored in memory 26. In one embodiment, current I is obtained by applying a load to battery 12. Microprocessor 24 calculates the conductance of battery 12 using the following equation:

$$\text{Conductance} = G_{BAT} = \frac{\Delta I}{\Delta V} \qquad \text{Equation 1}$$

where $\Delta I$ is the change in current flowing through battery 12 due to current source 76 and $\Delta V$ is the change in battery voltage due to applied current $\Delta I$.

Based upon the battery conductance $G_{BAT}$ and the battery voltage, the battery tester 10 determines the condition of battery 12. A temperature sensor 88 can be thermally coupled to battery 12 and used to compensate battery measurements. Temperature readings can be stored in memory 26 for later retrieval.

As mentioned above, microprocessor 24 operates at a frequency determined by system clock 82 and in accordance with programming instructions stored in memory 26. In accordance with the present invention, the programming instructions stored in memory 26 are locked and can be executed by microprocessor 24 upon receipt of a software unlocking key that corresponds to a predetermined software unlocking key.

Although the present invention has been described with reference to preferred embodiments, workers skilled in the art will recognize that changes may be made in form and detail without departing from the spirit and scope of the invention.

What is claimed is:

1. An electronic battery tester, comprising:

first and second connectors configured to electrically couple to terminals of a battery;

a microprocessor configured to test the battery using the first and second connectors;

a memory containing a first set of locked instructions for the microprocessor;

an input configured to receive a first software unlocking key; and the microprocessor configured to execute the first set of locked instructions in response to the first software unlocking key corresponding to a first predetermined software unlocking key, wherein the first set of locked instructions are a first set of battery testing instructions.

2. The electronic battery tester of claim 1 wherein the first predetermined software unlocking key including an encrypted serial number of the electronic battery tester, and wherein the encrypted serial number is stored in the memory.

3. The electronic battery tester of claim 1 wherein the microprocessor being configured to execute the first set of locked instructions in response to the first software unlocking key corresponding to the first predetermined software unlocking key further comprises the microprocessor being configured to execute the first set of locked instructions if the first software unlocking key corresponding to the first predetermined software unlocking key is stored in the memory.

4. The electronic battery tester of claim 1 wherein the microprocessor being configured to execute the first set of locked instructions in response to the first software unlocking key corresponding to the first predetermined software unlocking key further comprises the microprocessor being configured to execute the first set of locked instructions if a first status flag is set to a predetermined value in the memory.

5. The electronic battery tester of claim 1 wherein the microprocessor being configured to execute the first set of locked instructions in response to the first software unlocking key corresponding to the first predetermined software unlocking key further comprises the microprocessor being configured to execute the first set of locked instructions upon receipt of a start test command.

6. The electronic battery tester of claim 1 wherein the first set of locked instructions is one of a plurality of sets of locked instructions; the first software unlocking key is one of a plurality of software unlocking keys, and the first predetermined software unlocking key is one of a plurality of software unlocking keys, and wherein the microprocessor is configured to execute at least one of the plurality of sets of locked instructions in response to at least one of the plurality of software unlocking keys corresponding to at least one of the plurality of predetermined software unlocking keys.

7. The electronic battery tester of claim 6 wherein the plurality of locked instructions are enabled for one-time execution by setting a corresponding plurality of status flags to a predetermined value in the memory.

8. The electronic battery tester of claim 1 wherein the input comprises a keyboard.

9. The electronic battery tester of claim 1 wherein the input comprises a touchscreen keyboard.

10. The electronic battery tester of claim 1 wherein the input comprises a reader through which a card including the first software unlocking key can be swiped.

11. The electronic battery tester of claim 1 wherein the input is further configured to communicate with a remote system.

12. The electronic battery tester of claim 11 wherein the input is further configured to communicate with the remote system via a telephone line.

13. The electronic battery tester of claim 11 wherein the remote system is a personal computer.

14. The electronic battery tester of claim 11 wherein the remote system is a personal digital assistant.

15. The electronic battery tester of claim 1 wherein the input is further configured for radio frequency communication.

16. The electronic battery tester of claim 1 wherein the input is further configured for infrared communication.

17. The electronic battery tester of claim 1 wherein the input further comprises a radio frequency identification tag.

18. The electronic battery tester of claim 1 wherein the input further comprises a serial interface cable.

19. The electronic battery tester of claim 1 wherein the input further comprises a parallel interface cable.

20. The electronic battery tester of claim 1 wherein the input further comprises a universal serial bus interface cable.

21. The electronic battery tester of claim 1 wherein the input further comprises an IEEE 1394 interface cable.

22. The electronic battery tester of claim 1 wherein the input further comprises an Ethernet interface cable.

23. The electronic battery tester of claim 1 wherein the input further comprises a TCP/IP internet connection.

24. The electronic battery tester of claim 1 wherein the input further comprises a plug-in device.

25. The electronic battery tester of claim 24 wherein the plug-in device is a memory card.

26. The electronic battery tester of claim 24 wherein the plug-in device is a memory chip.

27. The electronic battery tester of claim 24 wherein the plug-in device is an identification button.

28. The electronic battery tester of claim 1 wherein the memory is configured to store additional instruction sets received from a remote system.

29. The electronic battery tester of claim 1 wherein the microprocessor determines a dynamic parameter of the battery upon execution of the first set of locked instructions.

30. The electronic battery tester of claim 29 wherein the dynamic parameter is battery conductance.

31. The electronic battery tester of claim 1 wherein the first and second connectors are Kelvin electrical connectors.

32. A method of testing a battery, comprising:

(a) providing a first and second connector configured to electrically couple to terminals of the battery;

(b) providing a microprocessor configured to test the battery using the first and second connectors;

(c) providing a memory containing a first set of locked instructions for the microprocessor;

(d) receiving a first software unlocking key; and (e) executing, with the microprocessor, the first set of locked instructions upon receipt of the first software unlocking key and upon the first software unlocking key corresponding to a first predetermined software unlocking key, wherein the first set of locked instructions are a first set of battery testing instructions.

33. The method of claim 32 wherein the first predetermined software unlocking key including an encrypted serial number of the electronic battery tester, and wherein the encrypted serial number is stored in the memory.

34. The method of claim 32 wherein the executing step (e) comprises executing the first set of locked instructions if the first software unlocking key corresponding to the first predetermined software unlocking key is stored in the memory.

35. The method of claim 32 wherein the executing step (e) comprises executing the first set of locked instructions if a first status flag is set to a predetermined value in the memory.

36. The method of claim 32 wherein the executing step (e) comprises executing the first set of locked instructions upon receipt of a start test command.

37. The method of claim 32 wherein the first set of locked instructions is one of a plurality of sets of locked instructions, the first software unlocking key is one of a plurality of software unlocking keys, and the first predetermined software unlocking key is one of a plurality of software unlocking keys, and wherein the executing step (e) comprises executing at least one of the plurality of sets of locked instructions in response to at least one of the plurality of software unlocking keys corresponding to at least one of the plurality of predetermined software unlocking keys.

* * * * *

UNITED STATES PATENT AND TRADEMARK OFFICE
CERTIFICATE OF CORRECTION

PATENT NO.        : 7,012,433 B2
APPLICATION NO. : 10/246439
DATED             : March 14, 2006
INVENTOR(S)       : Clark E. Smith et al.

It is certified that error appears in the above-identified patent and that said Letters Patent is hereby corrected as shown below:

Title Page 2
Item (56) References Cited:

delete "Buckler et al." and insert --Barkler et al.--

Column 9
Line 55 delete ";" and insert --,--

Signed and Sealed this

Fourteenth Day of July, 2009

JOHN DOLL
*Acting Director of the United States Patent and Trademark Office*